(12) United States Patent
Huang et al.

(10) Patent No.: US 12,021,110 B2
(45) Date of Patent: Jun. 25, 2024

(54) THREE-IN-ONE RGB MINI-LED DEVICE

(71) Applicant: EXCELLENCE OPTOELECTRONICS INC., Miaoli County (TW)

(72) Inventors: Kuo-Hsin Huang, Miaoli County (TW); Tsung-Hsiang Chen, Miaoli County (TW); Tsung-Ting Hua, Miaoli County (TW); Tzeng-Guang Tsai, Miaoli County (TW); Yung-Hsiang Chao, Miaoli County (TW); Hao-Chung Kuo, Zhubei (TW); Sung-Wen Huang Chen, Nantou County (TW); Fang-Jyun Liou, Taipei (TW); An-Chen Liu, Taichung (TW)

(73) Assignee: EXCELLENCE OPTOELECTRONICS INC., Miaoli County (TW)

( * ) Notice: Subject to any disclaimer, the term of this patent is extended or adjusted under 35 U.S.C. 154(b) by 529 days.

(21) Appl. No.: 17/104,301

(22) Filed: Nov. 25, 2020

(65) Prior Publication Data

US 2022/0059606 A1 Feb. 24, 2022

(30) Foreign Application Priority Data

Aug. 19, 2020 (TW) .................. 109128160

(51) Int. Cl.
*H01L 27/15* (2006.01)
*H01L 33/06* (2010.01)
(Continued)

(52) U.S. Cl.
CPC ............ *H01L 27/156* (2013.01); *H01L 33/06* (2013.01); *H01L 33/405* (2013.01); *H01L 33/44* (2013.01);
(Continued)

(58) Field of Classification Search
CPC ....... H01L 27/156; H01L 33/04; H01L 33/06; H01L 33/405; H01L 33/60; H01L 27/153;
(Continued)

(56) References Cited

U.S. PATENT DOCUMENTS

| | | | |
|---|---|---|---|
| 2013/0026518 A1 | 1/2013 | Suh et al. | |
| 2017/0250318 A1* | 8/2017 | Cha | H01L 33/504 |
| 2017/0294479 A1* | 10/2017 | Cha | H01L 27/156 |

FOREIGN PATENT DOCUMENTS

| | | | |
|---|---|---|---|
| CN | 108899405 A * | 11/2018 | .......... H01L 33/007 |
| CN | 110808328 A | 2/2020 | |

OTHER PUBLICATIONS

English translation CN-108899405-A 2018.*
Taiwan Patent Office, Office action dated Jun. 3, 2021.

* cited by examiner

*Primary Examiner* — Latanya N Crawford Eason
(74) *Attorney, Agent, or Firm* — Li & Cai Intellectual Property (USA) Office

(57) ABSTRACT

A three-in-one RGB mini-LED device includes a substrate, a second electrical semiconductor layer, a plurality of multiple-quantum well layers, a plurality of first electrical semiconductor layers, and a plurality of mirrors. The second electrical semiconductor layer is disposed on the substrate. The plurality of multiple-quantum well layers are disposed on the second electrical semiconductor layer. An area of each of the plurality of multiple-quantum well layers is smaller than an area of the second electrical semiconductor layer, and a region on the second semiconductor layer is not covered by the plurality of multiple-quantum well layers.

18 Claims, 15 Drawing Sheets

(51) Int. Cl.
*H01L 33/40* (2010.01)
*H01L 33/44* (2010.01)
*H01L 33/50* (2010.01)
*H01L 33/58* (2010.01)
*H01L 33/62* (2010.01)

(52) U.S. Cl.
CPC ............ *H01L 33/505* (2013.01); *H01L 33/58* (2013.01); *H01L 33/62* (2013.01); *H01L 2933/0016* (2013.01); *H01L 2933/0025* (2013.01); *H01L 2933/0041* (2013.01); *H01L 2933/0058* (2013.01); *H01L 2933/0066* (2013.01)

(58) Field of Classification Search
CPC ............. H01L 2933/0058; H01L 33/44; H01L 2933/0025; H01L 33/502; H01L 33/504; H01L 33/505; H01L 2933/0041; H01L 2933/0016; H01L 2933/0066
See application file for complete search history.

THREE-IN-ONE RGB MINI-LED DEVICE

FIELD OF THE DISCLOSURE

The present disclosure relates to a three-in-one RGB (red, green, blue) mini-LED (light-emitting diode) device, and more particularly to a three-in-one RGB mini-LED device adopted in an RGB quantum dot LED display having a three-in-one RGB mini-LED structure.

BACKGROUND OF THE DISCLOSURE

In the current lighting market, with features such as high-luminance, energy-saving, multi-color, and fast-changing, LED (light-emitting diode) has been widely applied in technical fields of lighting that require light sources, particular in the field of vehicle lamp. Conventional arts include Taiwan Patent number M544122, entitled "LED of generating various luminous colors on single wafer". This conventional art has disadvantages such as when attempting to have a single wafer to provide light effects of different colors, different color materials need to be used in conjunction during a manufacturing process of semiconductors. In other words, materials of different light wavelengths need to be used according to requirements of different colors. The process required in the entire production process becomes more complex. In addition, the conventional art does not allow RGB (red, green, blue) LED lamps of different shapes to be made according to requirements of customer on different lamp and display devices.

SUMMARY OF THE DISCLOSURE

In response to the above-referenced technical inadequacies, the present disclosure provides a three-in-one RGB (red, green, blue) mini-LED (light-emitting diode) device, and the three-in-one RGB mini-LED device not only can have a light-emitting surface of a wafer to be partitioned into a plurality of light-emitting regions, but also effectively improve on disadvantages of existing technologies by only using a single light source wavelength material in the composition of product, in conjunction with a quantum dot filter to emit lights in three colors of RGB. In addition, through the design of flip-chip process in the present disclosure, the three-in-one RGB mini-LED device becomes an LED light-emitting component having RGB quantum dot materials, such that lateral sides of electrical semiconductor layers of the present disclosure are less likely to be damaged in a packaging process, thereby obtaining an RGB mini-LED structure having smaller size, higher light utilization rate, and precision controlled lighting pattern. Moreover, the three-in-one RGB mini-LED device of the present disclosure can also be cut into customized shapes according to requirements of customer and formed into displays of different sizes.

In one aspect, the three-in-one RGB mini-LED device provided in the present disclosure includes an arrangement of a plurality of display cells, and each of the display cells includes a substrate, a second electrical semiconductor layer, a plurality of multiple-quantum well layers, a plurality of first electrical semiconductor layers, a plurality of mirrors, a protecting layer, a plurality of first metal electrodes, a second metal electrode, and an RGB quantum dot filter. The second electrical semiconductor layer is disposed on the substrate. The multiple-quantum well layers are disposed on the second electrical semiconductor layer, an area of each of the multiple-quantum well layers is smaller than an area of the second electrical semiconductor layer, and a portion of the second electrical semiconductor layer is not covered by the multiple-quantum well layers. The first electrical semiconductor layers are correspondingly disposed on the multiple-quantum well layers, and an area of each of the first electrical semiconductor layers is equal to the area of each of the multiple-quantum well layers. The mirrors are correspondingly disposed on the first electrical semiconductor layers and are in electrical contact with the first electrical semiconductor layers, and an area of each of the mirrors is smaller than the area of each of the first electrical semiconductor layers. The protecting layer is covered on lateral sides of and above each of the mirrors and lateral sides of and above each of the first electrical semiconductor layers, and the protecting layer is covered on the second electrical semiconductor layer. The protecting layer exposes a plurality of first contact areas and a second contact area. Each of the first metal electrodes is correspondingly disposed on each of the first contact areas. The second metal electrode is disposed on the second contact area. The RGB quantum dot filter is disposed at a bottom of the substrate.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
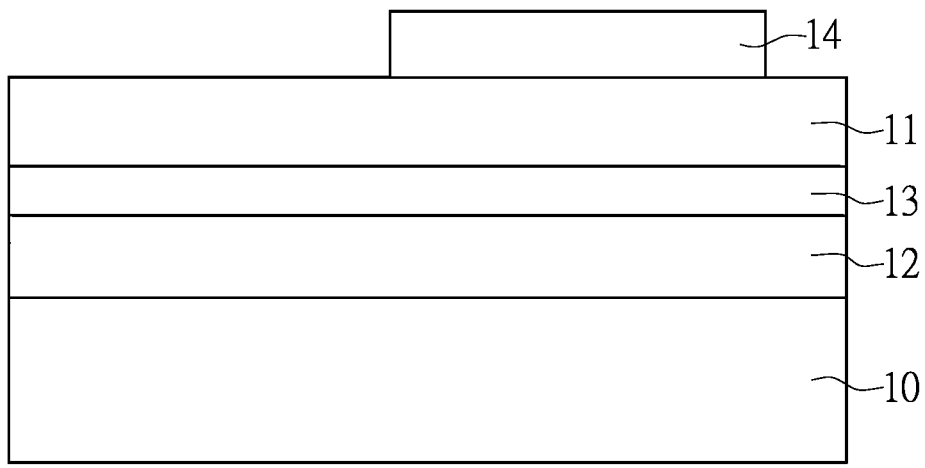
FIG. 1 is a side schematic view of implementing a mirror in an embodiment of the present disclosure.

The present disclosure is related to a three-in-one RGB (red, green, blue) mini-LED (light-emitting diode) device capable of effectively improving and elevating the quality of a lamp body. In a flip-chip process, after completing a cutting step, the three-in-one RGB mini-LED device can be formed into different RGB mini-LED light-emitting chips according to requirements of design, and become LED light-emitting components having RGB quantum dot materials. In the present disclosure, a variety of RGB LED bars or LED light strips having suitable shapes and sizes can also be selected according to requirements of design, in conjunction with other necessary electrical components, connector and driving integrated circuit, and mount the LED die on the circuit board selected according to requirements of design using surface-mount technology, thereby completing the production of an RGB light source mini-LED light-emitting device, and obtaining an RGB mini-LED structure having smaller size, higher light utilization rate, and precision controlled lighting pattern.

The present disclosure is more particularly described in the following examples that are intended as illustrative only since numerous modifications and variations therein will be apparent to those skilled in the art. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure. In the drawings, sizes and relative positions and distances of RGB LED die, RGB LED member, LED, substrate, circuit board, etc., may be exaggerated for the purpose of clarity, however, like numbers in the drawings indicate like components throughout the views.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

For a more clear description of the three-in-one RGB mini-LED device of the present disclosure, steps of the production process of the three-in-one RGB mini-LED device is iterated first, and structures of the three-in-one RGB mini-LED device will be described in related descriptions of FIG. 9A to 9C, so as to have a more coherent and complete technical description of the present disclosure.

Reference is made to FIG. 1, which is a side schematic view of a first embodiment of production process of the three-in-one RGB mini-LED device of the present disclosure, and a structure of a display cell 1 (i.e., display unit) is disclosed. The structure contains, sequentially from bottom to top, a substrate 10, a second electrical semiconductor layer 12, a multiple-quantum well layer 13, a first electrical semiconductor layer 11, and a plurality of mirrors 14 (FIG. 1 shows a side view of the display cell 1, therefore only one mirror is shown, and the plurality of mirrors 14 may be seen as in embodiments shown in FIG. 9C). That is, the second electrical semiconductor layer 12 is deposited on the substrate 10, the multiple-quantum well layer 13 and the first electrical semiconductor layer 11 are sequentially deposited on the second electrical semiconductor layer 12, and the plurality of mirrors 14 are deposited on the first electrical semiconductor layer 11, such that the plurality of mirrors 14 are in electrical contact with the first electrical semiconductor layer 11. The material of the substrate 10 may be sapphire or other oxide materials. The first electrical semiconductor layer 11 and the second electrical semiconductor layer 12 are epitaxial (EPI) silicone layers, or epitaxial layers. The multiple-quantum well (MQW) layer 13 may be an optical layer of a multiple-quantum well nanorod of indium gallium nitride or gallium nitride. The mirror 14 is made of metal, such as silver, aluminum, or nickel, or a laminated layer of silver-aluminum, aluminum-nickel, or silver-nickel, or a laminated layer of silver-aluminum-nickel, and the present disclosure is not limited thereto. In addition, in actual implementations, the mirror 14 of the present disclosure may also be a protecting layer capable of providing protection. Moreover, FIG. 1 also shows the first step of the production process of the three-in-one RGB mini-LED device of the present disclosure, which includes depositing the mirror 14 on the first electrical semiconductor layer 11, such that the mirror 14 is in electrical contact with the first electrical semiconductor layer 11.

It should be noted that, contents disclosed in FIG. 1 only take one component as an example, to facilitate a description to correlate figures to the text. In actual production, production steps are based on process for manufacturing a piece of semiconductor wafer.

Figure 2:
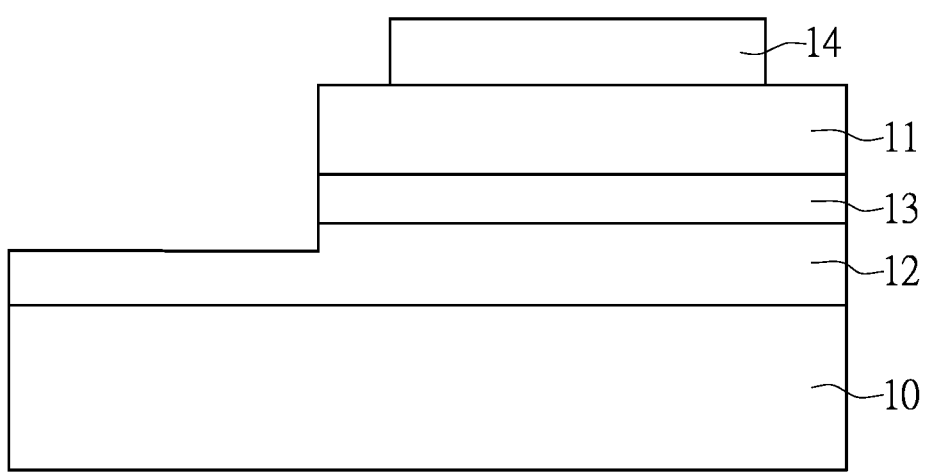
FIG. 2 is a side schematic view of implementing an etching process in an embodiment of the present disclosure.
Figure 9A:
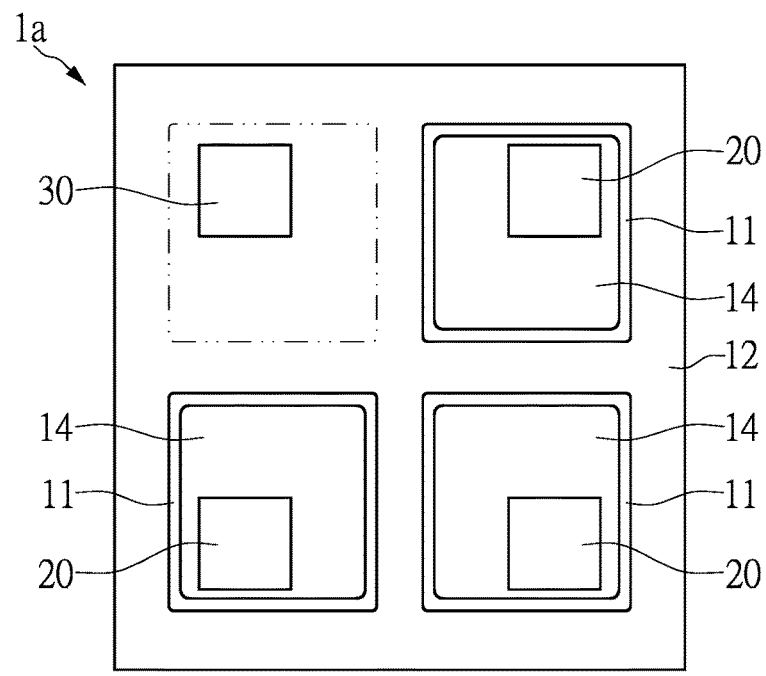
FIG. 9A is a bottom schematic view of a product embodiment in the present disclosure.
Figure 9B:
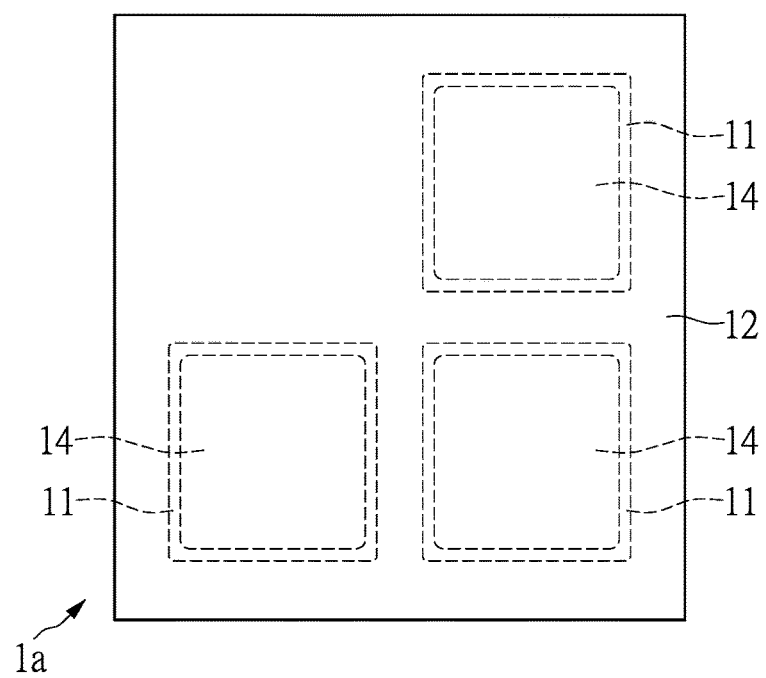
FIG. 9B is a top schematic view of the embodiment of FIG. 9A in the present disclosure.
Figure 9C:
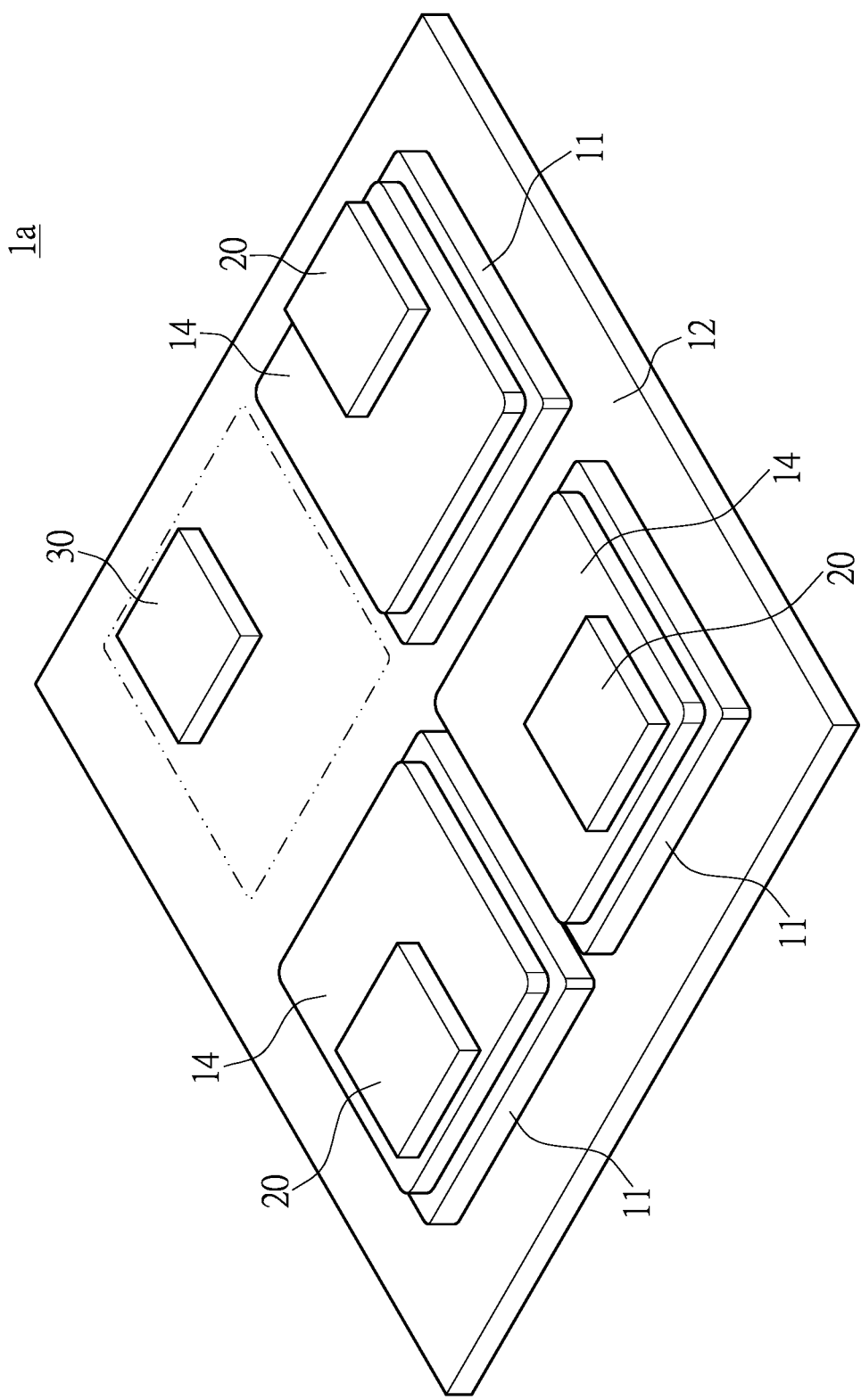
FIG. 9C is a perspective schematic view of the embodiment of FIG. 9A in the present disclosure.

FIG. 2 shows the second step in the process for producing the three-in-one RGB mini-LED device of the present disclosure, in which a dry etching manner or a wet etching manner is utilized to etch the first electrical semiconductor layer 11 and the multiple-quantum well layer 13, thereby exposing the second electrical semiconductor layer 12, and forming a plurality of first electrical semiconductor layers 11, and an area of each of the first electrical semiconductor layers 11 is substantially greater than an area of each of the mirrors 14 (as shown in FIG. 9C).

Figure 3:
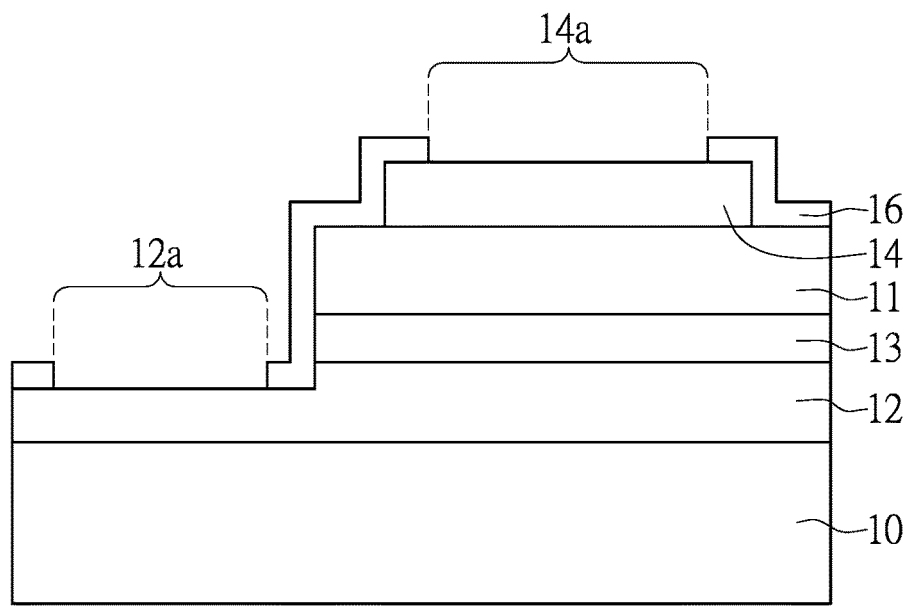
FIG. 3 is a side schematic view of implementing a protecting layer in an embodiment of the present disclosure.

FIG. 3 shows the third step in the process for producing the three-in-one RGB mini-LED device of the present disclosure, the step for depositing a protecting layer 16 includes depositing the protecting layer 16 after the second step, and exposing a first contact area 14a above the mirror 14, and exposing a second contact area 12a above the second electrical semiconductor layer 12. The depositing step deposits metal oxides or metal nitrides (e.g., silicon dioxide, silicon nitride, or titanium dioxide, etc.) at lateral sides of and above the above-mentioned metallic mirror 14, and exposing the first contact area 14a above the metallic mirror 14, that is, the first contact area 14a is an opening area of the protecting layer 16 above the mirror 14. At the same time, metal oxides or metal nitrides are also deposited at lateral sides of and above the above-mentioned second electrical semiconductor layer 12, and exposing the second contact area 12a above the second electrical semiconductor layer 12, that is, the second contact area 12a is an opening area of the protecting layer 16 above the second electrical semiconductor layer 12.

Figure 4:
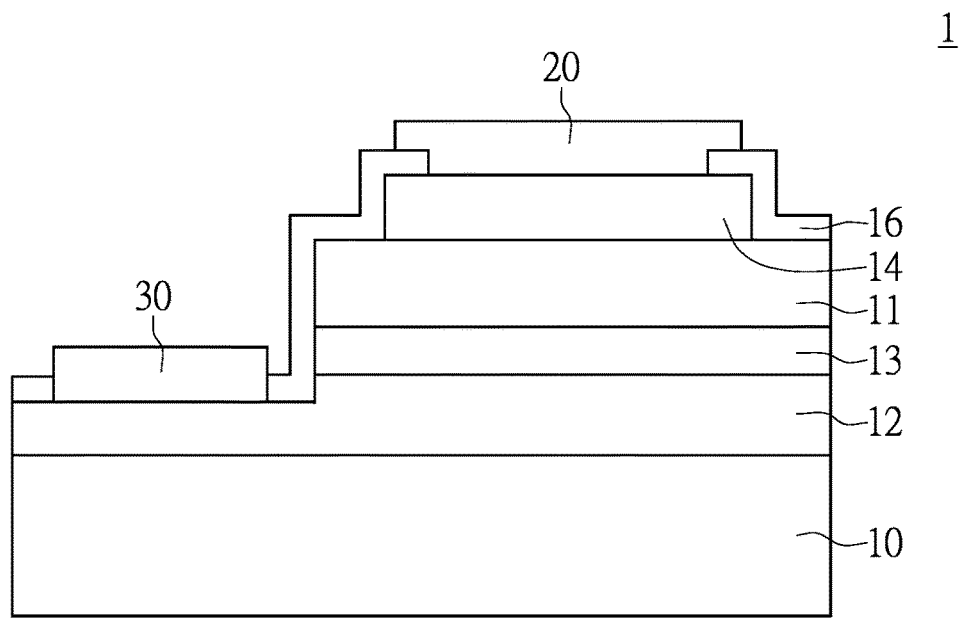
FIG. 4 is a side schematic view of implementing metal electrodes in an embodiment of the present disclosure.

FIG. 4 shows the fourth step in the process for producing the three-in-one RGB mini-LED device of the present disclosure, which includes disposing and forming a first metal electrode 20 above the first contact area 14a, such that an area formed by the first metal electrode 20 is greater than the first contact area 14a. At the same time, a second metal electrode 30 is disposed above the second contact area 12a, such that an area formed by the second metal electrode 30 is greater than the second contact area 12a. During actual usage, the material of the first metal electrode 20 and the second metal electrode 30 may be titanium/platinum/gold, or chromium/platinum/gold.

Figure 5:
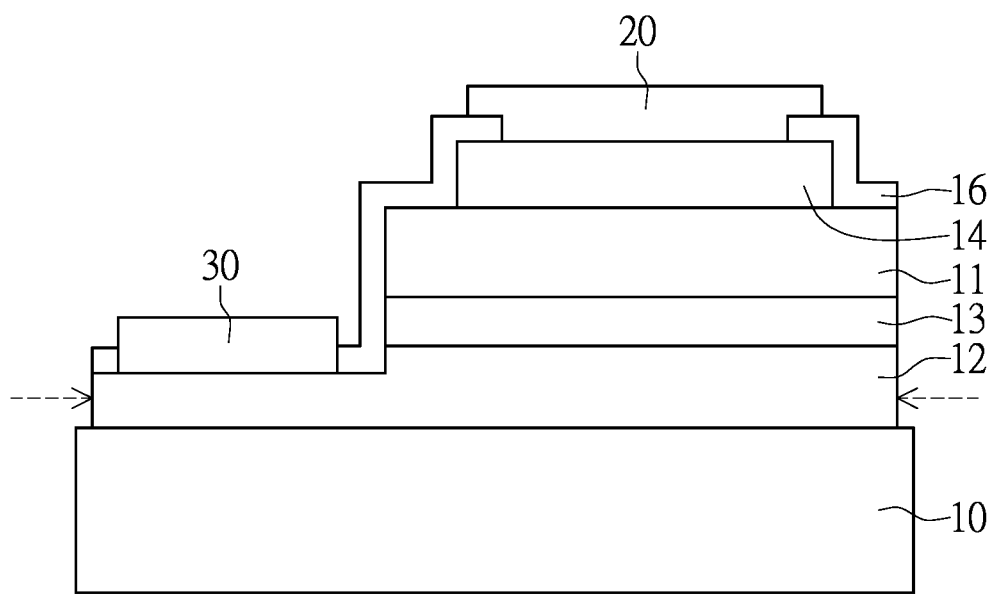
FIG. 5 is a side schematic view of implementing another etching process in an embodiment of the present disclosure.

FIG. 5 shows the fifth step in the process for producing the three-in-one RGB mini-LED device of the present disclosure. After the fourth step, a dry etching manner or a wet etching manner is utilized to etch edges of the second electrical semiconductor layer 12 of a component structure shown in FIG. 4, and the substrate 10 is exposed to form a spacing region 5 (the spacing region 5 is as shown in FIG. 7B). A direction indicated by a dotted line at a left side of FIG. 5 represents etching along a direction toward a right side of FIG. 5, and edges of the protecting layer 16 above the second electrical semiconductor layer 12 are etched. A direction indicated by a dotted line at the right side of FIG. 5 represents etching along a direction toward the left side of FIG. 5, and the edges of the second electrical semiconductor layer 12, the multiple-quantum well layer 13, the first electrical semiconductor layer 11 and the protecting layer 16 are etched to form the spacing region 5.

Figure 6A:
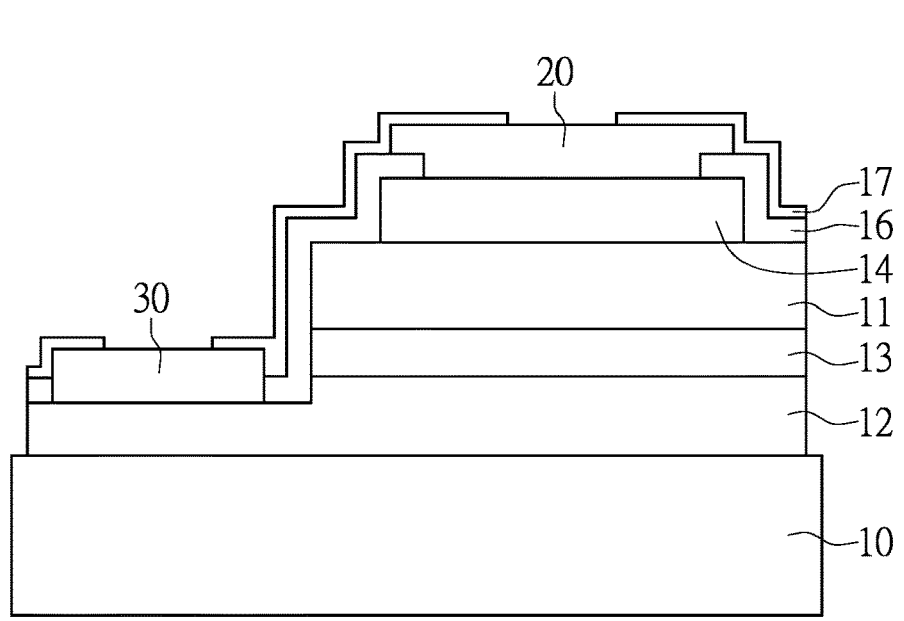
FIG. 6A is a side schematic view of implementing a covering layer in an embodiment of the present disclosure.

As shown in FIG. 6A, in one embodiment of the present disclosure, a covering layer 17 is further formed. A layer of non-electrically-conductive layer (i.e., the covering layer 17) is covered on a component structure shown in FIG. 5, the covering layer 17 only exposes a partial area of the above-mentioned first metal electrode 20 and a partial area of the above-mentioned second metal electrode 30, without covering on the spacing region 5. That is, the covering layer 17 covers the lateral sides of and above the first metal electrode 20 and exposes the partial area of the first metal electrode 20 thereabove, and covers the lateral sides of and above the second metal electrode 30 and exposes the partial area of the second metal electrode 30 thereabove. In actual manufacturing, the material of the covering layer 17 is titanium dioxide or silicon dioxide.

Figure 6B:
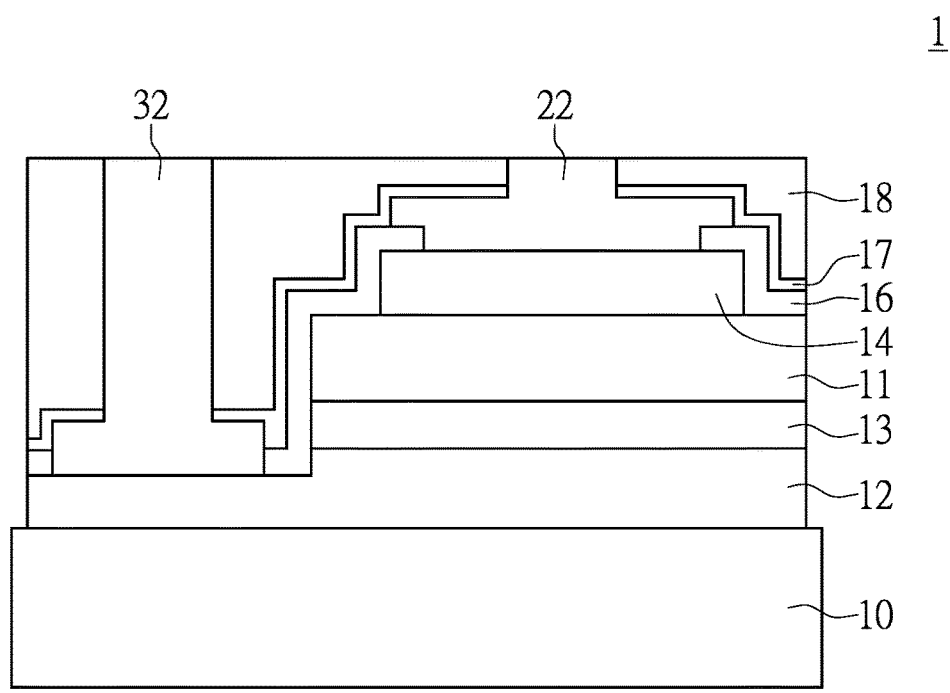
FIG. 6B is a side schematic view of implementing metal electrode bumps in an embodiment of the present disclosure.

As shown in FIG. 6B, a step of forming solder bumps is further performed on the embodiment shown in FIG. 6A. A first metal electrode bump 22 is formed above the first metal electrode 20, and a second metal electrode bump 32 is formed above the second metal electrode 30, as shown in FIG. 6B. After the step of forming solder bumps, a step of covering a dielectric material 18 above the covering layer 17 is performed, the dielectric material 18 is not covered on the spacing region 5, and the dielectric material 18 is neither covered above the first metal electrode bump 22 nor above the second metal electrode bump 32. In practical production, the dielectric material 18 can be such as epoxy or silicone. Furthermore, in FIG. 6B, technologies such as thin film process, chemical plating, or printing technology may be utilized to straighten spaces between electrodes of the first metal electrode bump 22 and the second metal electrode bump 32.

It should be noted that, under different circumstances, such as when a manufacturer implements embodiments disclosed by FIGS. 6A and 6B, according to actual requirements or requirements from different operational conditions, production process shown in FIGS. 6A and 6B may be omitted. The above-mentioned production process shown in FIGS. 6A and 6B may be operated by different manufacturers, or be processed and manufactured outside of core production process.

Figure 7A:
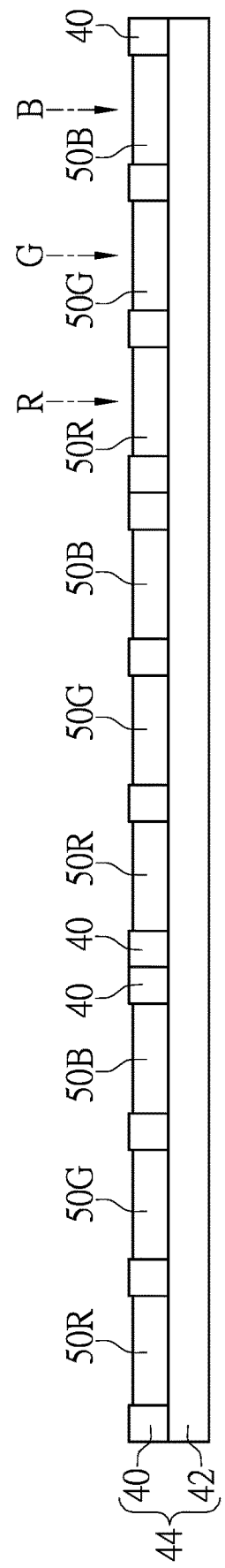
FIG. 7A is a side schematic view of implementing a RGB quantum dot filter in an embodiment of the present disclosure.
Figure 7B:
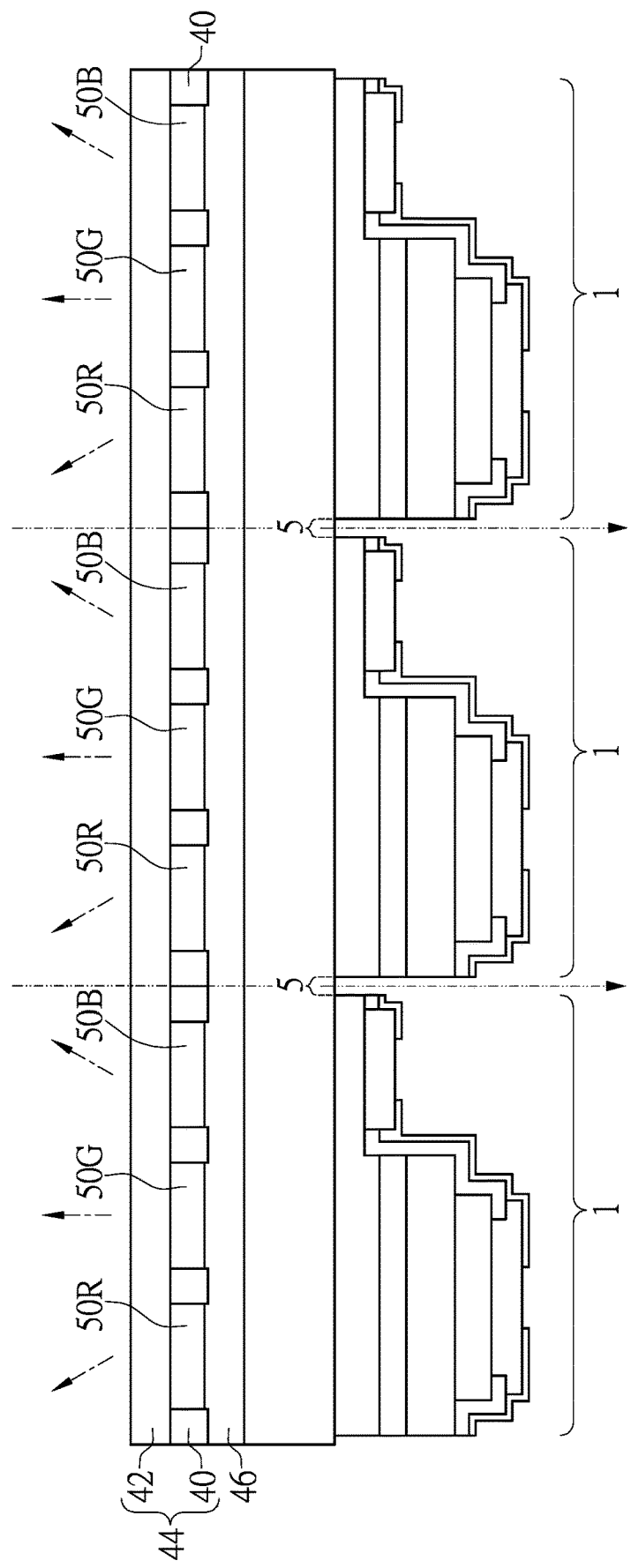
FIG. 7B is a side schematic view for cutting the embodiment in FIG. 7A of the present disclosure after the embodiment in FIG. 7A are assembled with components.

FIG. 7A shows the sixth step in the process for producing the three-in-one RGB mini-LED device of the present disclosure, and the sixth step includes preparing an RGB quantum dot filter 44, and adhering the RGB quantum dot filter 44 at a bottom of the above-mentioned sapphire substrate 10. The manner of preparing the RGB quantum dot filter 44 includes: forming a plurality of dams 40 on a transparent substrate 42 using an opaque material; the dams 40 are formed through performing photolithography on the opaque material, thereby forming the light-blocking dams 40. In the dams 40, in conjunction with quantum dot materials of various wavelengths, coating the quantum dot materials of various wavelengths into the dams 40 to form the RGB quantum dot filter (QD filter) 44 or an RGB wafer. In actual implementations, the quantum dot materials of various wavelengths include: red quantum dot material 50R, green quantum dot material 50G, and blue quantum dot material 50B.

Reference is made to FIG. 7B, which is a schematic view of the RGB quantum dot filter 44 adhering to the bottom of the substrate 10 as shown in FIG. 7A, and the RGB quantum dot filter 44 is adhered to the bottom of the substrate 10 by using adhering glue 46. Afterwards, a cutting step is performed, and the above-mentioned spacing region 5 is cut along directions of arrows indicated by the phantom lines of the FIG. 7B. The cutting step is to perform customized cutting operation according to the shapes or sizes required by the customer, in order to meet aesthetic requirement of special lamp design by the customer. Therefore, steps of flip-chip process of an RGB mini-LED is completed, and the flip-chip structure of the RGB mini-LED is also completed at the same time. The material of the adhering glue 46 may be UV glue (ultraviolet curing glue), epoxy or silicone, etc. In addition, directions of arrows represented by the center lines of the FIG. 7B indicate the light-emitting directions of an LED through the RGB quantum dot filter 44.

Figure 8A:
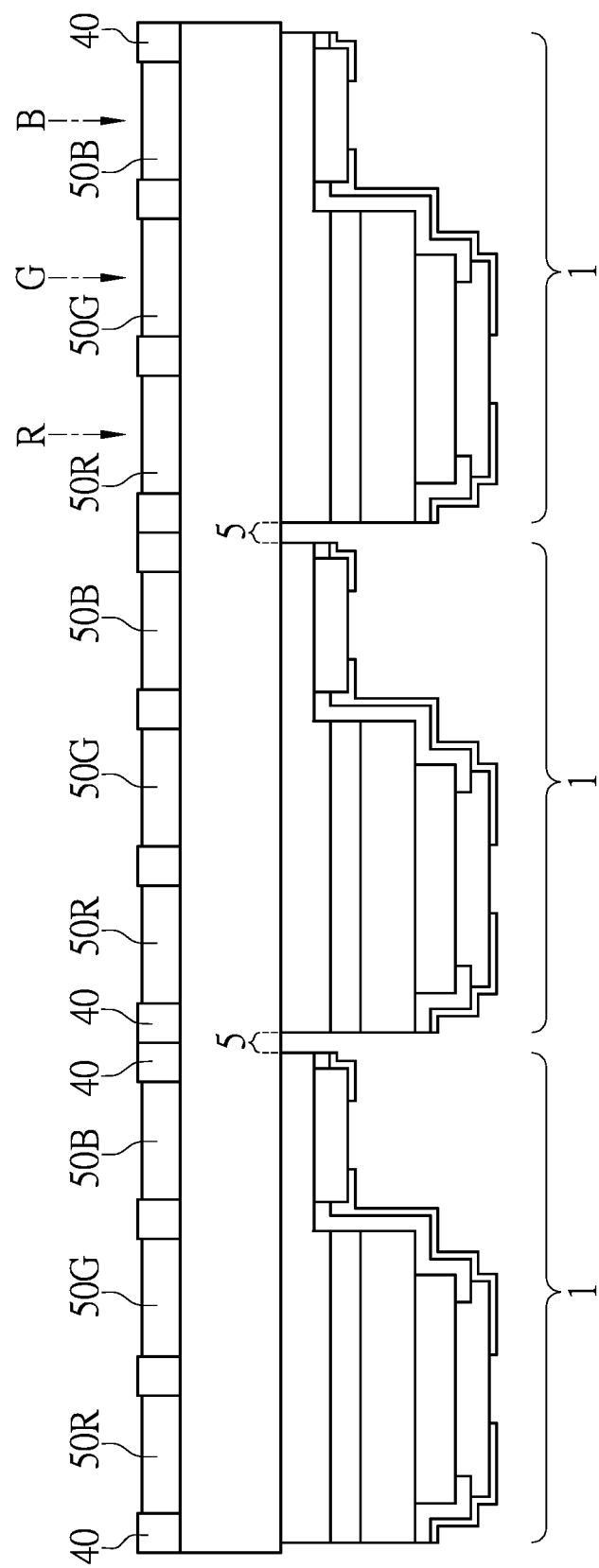
FIG. 8A is a side schematic view of an RGB quantum dot being assembled with components in another embodiment of the present disclosure.
Figure 8B:
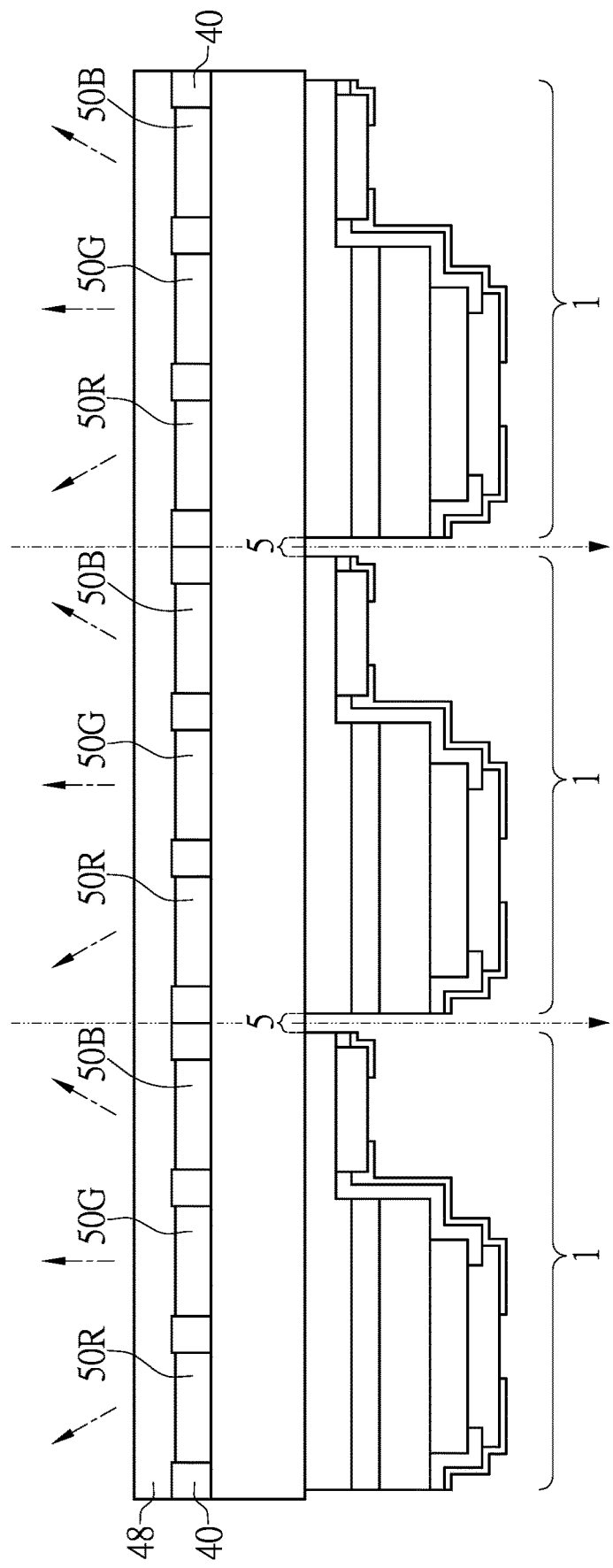
FIG. 8B is a side schematic view for cutting the embodiment of FIG. 8A in the present disclosure.

Reference is made to FIG. 8A and FIG. 8B, which represent another embodiment related to the production of the quantum dot material in FIG. 7A and FIG. 7B. In FIG. 8A, photolithography is performed directly on a back side of the above-mentioned substrate 10 to produce the plurality of dams 40, which are also light-blocking dams, that is, the material of the transparent substrate 42 of FIG. 7A is omitted, thereby reducing a thickness of the entire component. In FIG. 8A, after the dams 40 are formed, the quantum dot materials of various wavelengths are coated in the dams 40, respectively. In actual implementations, the quantum dot materials of various wavelengths include: the red quantum dot material 50R, the green quantum dot material 50G, and the blue quantum dot material 50B. As shown in FIG. 8B, packaging glue 48 is covered above the structure of a layer of the dams 40 as shown in FIG. 8A, and the material of the packaging glue, in actual production, may be a UV glue (ultraviolet curing glue), epoxy or silicone, etc. After packaging is completed, a cutting step is performed. The above-mentioned spacing region 5 is the baseline for cutting, and a customized cutting operation is performed according to the shapes or sizes required by the customer, in order to meet aesthetic requirement of special lamp design of the customer.

FIGS. 9A, 9B, and 9C show one embodiment of an actual product, FIG. 9A is a schematic bottom view of a display cell 1a (i.e., display unit), FIG. 9B is a top view of FIG. 9A, and FIG. 9C is a perspective schematic view of FIG. 9A (to clearly explain a relative position of each of the layers, thicknesses of the layers are exaggerated as shown in FIG. 9C, and thickness of the actual product does not follow a ratio of thickness as shown in FIG. 9C). It should be noted that, the materials of each of the layers disclosed in FIG. 9A and FIG. 9B are basically transparent, such that an internal stacking relation can be observed in a top view or a bottom view of the component. As shown in FIG. 9C, a structure of the three-in-one RGB mini-LED device of the display cell 1a (i.e., display unit) is described as follows, which includes the substrate 10, the second electrical semiconductor layer 12, the multiple-quantum well layers 13, the first electrical semiconductor layers 11, and the mirrors 14. Similarly, in FIG. 9C, the second electrical semiconductor layer 12 is disposed on the substrate 10, an area of each of the multiple-quantum well layers 13 is smaller than an area of the second electrical semiconductor layer 12, a portion of the second electrical semiconductor layer 12 is not covered by the multiple-quantum well layers 13, and the portion is as shown by the phantom line in FIG. 9C. In FIG. 9C, the first electrical semiconductor layers 11 are correspondingly disposed on the multiple-quantum well layers 13, and an area of each of the first electrical semiconductor layers 11 is equal to the area of each of the multiple-quantum well layers 13. The plurality of mirrors 14 are correspondingly disposed on the first electrical semiconductor layers 11 and are in electrical contact with the first electrical semiconductor layers 11, and an area of each of the mirrors 14 is smaller than the area of each of the first electrical semiconductor layers 11.

In FIG. 9C, the mirrors 14 are shown, however, in actual production, FIG. 9C further includes the protecting layer 16 (as shown in FIG. 3), that is, the protecting layer 16 is covered on lateral sides of and above each of the mirrors 14 and lateral sides of and above each of the first electrical semiconductor layers 11, and the protecting layer 16 is covered on the second electrical semiconductor layer 12. The protecting layer 16 also exposes a plurality of first contact areas 14a and a second contact area 12a (as shown in FIG. 3). Furthermore, FIG. 9C includes a plurality of first metal electrodes 20, and each of the first metal electrodes 20 is correspondingly disposed on each of the first contact areas 14a. FIG. 9C further includes the second metal electrode 30 disposed on the second contact area 12a (as shown in FIG. 4). FIG. 9C further includes the RGB quantum dot filter 44 that is disposed at a bottom of the substrate 10 (as shown in FIG. 7B).

The RGB quantum dot filter 44 includes the transparent substrate 42, the plurality of dams 40, and the quantum dot materials of various wavelengths 50R, 50G, and 50B. The dams 40 are disposed on the transparent substrate 42, and each of the dams 40 is an opaque dam. Each of the quantum dot materials of various wavelengths 50R, 50G, and 50B are correspondingly disposed in each of the dams 40.

Furthermore, the first contact areas 14a indicate that the protecting layer 16 has an opening formed above each of the mirrors 14 and exposes an upper surface of each of the mirrors 14, and edges of each of the mirrors 14 are still cladded by the protecting layer 16. The second contact areas 12a indicate that the protecting layer 16 has an opening formed above a region above the second electrical semiconductor layer 12 that is not covered by the multiple-quantum well layers 13 and exposes a top surface of the second electrical semiconductor layer 12. An area cladded by each of the first metal electrodes 20 is greater than each of the first contact areas 14a, and an area cladded by the second metal electrode 30 is greater than the second contact area 12a.

FIG. 6A includes the covering layer 17 that is covered on the protecting layer 16, and covered on each of the first metal electrodes 20 and exposes partial areas of upper surfaces of each of the first metal electrodes 20. The covering layer 17 is covered on the second metal electrode 30 and exposes a partial area of an upper surface of the second metal electrode 30. FIG. 6B includes, in conjunction with FIG. 7B, the first metal electrode bumps 22. Each of the first metal electrode bumps 22 is correspondingly disposed on the upper surfaces of each of the first metal electrodes 20 having the partial areas exposed. The second metal electrode bump is disposed on the upper surface of the second metal electrode 30 having the partial area exposed. FIG. 6B further includes the dielectric material 18 that covers on the covering layer 17, and the dielectric material 18 does not cover upper sides of each of the first metal electrode bumps 22, and does not cover an upper side of the second metal electrode bump 32. In FIG. 7B, the spacing zone 5 is positioned between different adjacent display cells 1. As for the embodiment of different RGB quantum dot filters of FIG. 8A and FIG. 8B, as iterated above, the dams 40 are disposed at the bottom of the substrate 10, and each of the dams 40 is an opaque dam. This embodiment further include the quantum dot materials of various wavelengths 50R, 50G, and 50B, each of the quantum dot materials of various wavelengths 50R, 50G, and 50B are correspondingly disposed in each of the dams 40.

Figure 10A:
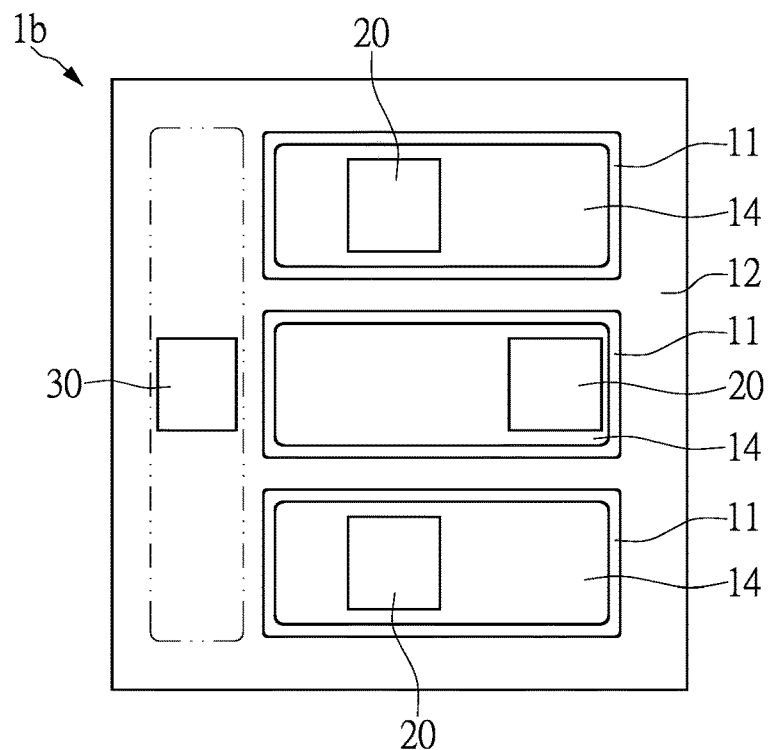
FIG. 10A is a bottom schematic view of another product embodiment in the present disclosure.
Figure 10B:
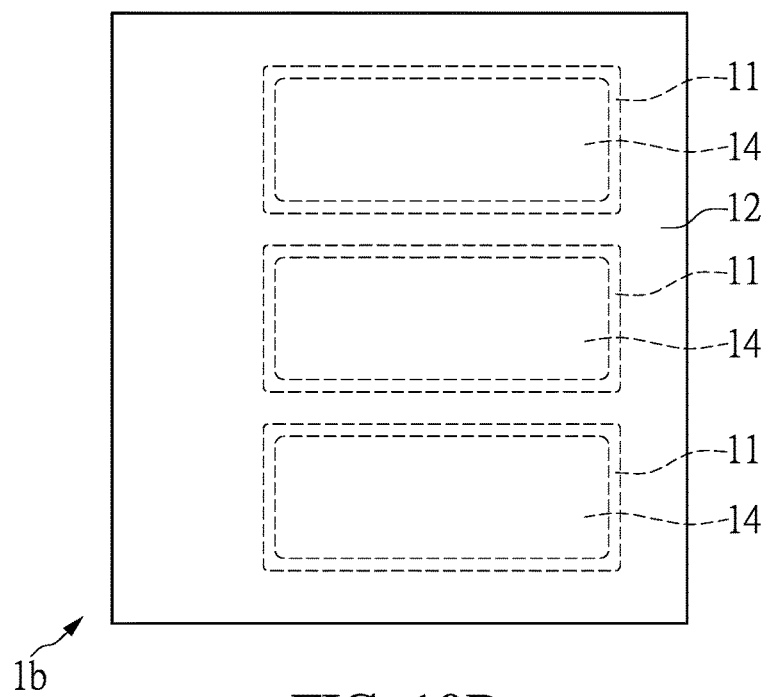
FIG. 10B is a top schematic view of the embodiment of FIG. 10A in the present disclosure.

FIG. 10A and FIG. 10B disclose another embodiment of a display cell 1b (i.e., display unit). FIG. 10A is a bottom view of another product implementation relative to the actual product of FIG. 9A, the difference is that the RGB is in a square-shaped matrix arrangement in FIG. 9A, and FIG. 10A shows a perpendicular arrangement (i.e., a horizontal arrangement when viewed from another angle). For the structure shown in FIG. 10A, the manufacturing steps of the substrate 10, the second electrical semiconductor layer 12, the multiple-quantum well layers 13, the first electrical semiconductor layers 11, and the mirrors 14 are the same as that of FIG. 9A. Similarly, FIG. 10A can further include the protecting layer 16, the first metal electrode 20, the second metal electrode 30, and a stacking structure including the RGB quantum dot filter 44. In addition, FIG. 10B is a top view of FIG. 10A.

Figure 11A:
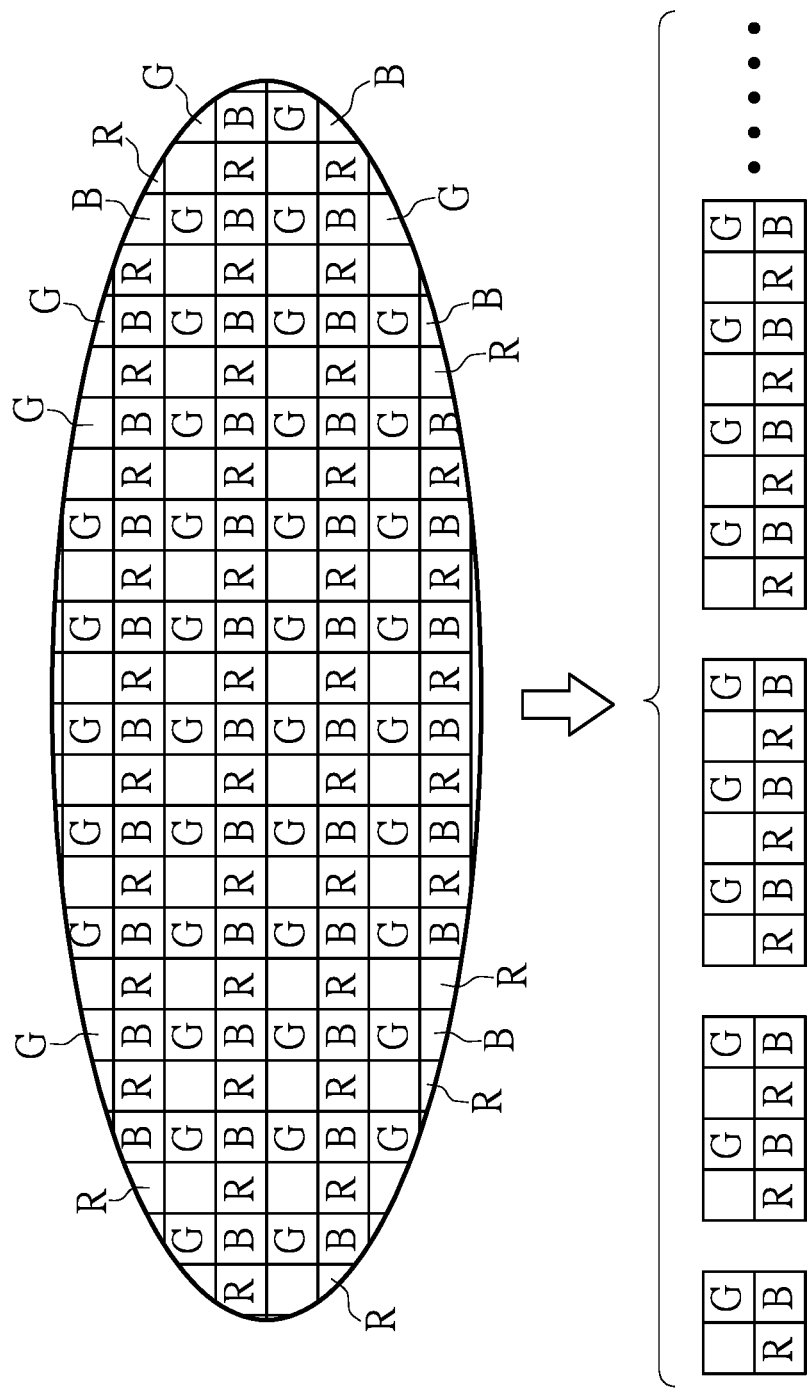
FIG. 11A is a schematic view of arranging and cutting products of the present disclosure.
Figure 11B:
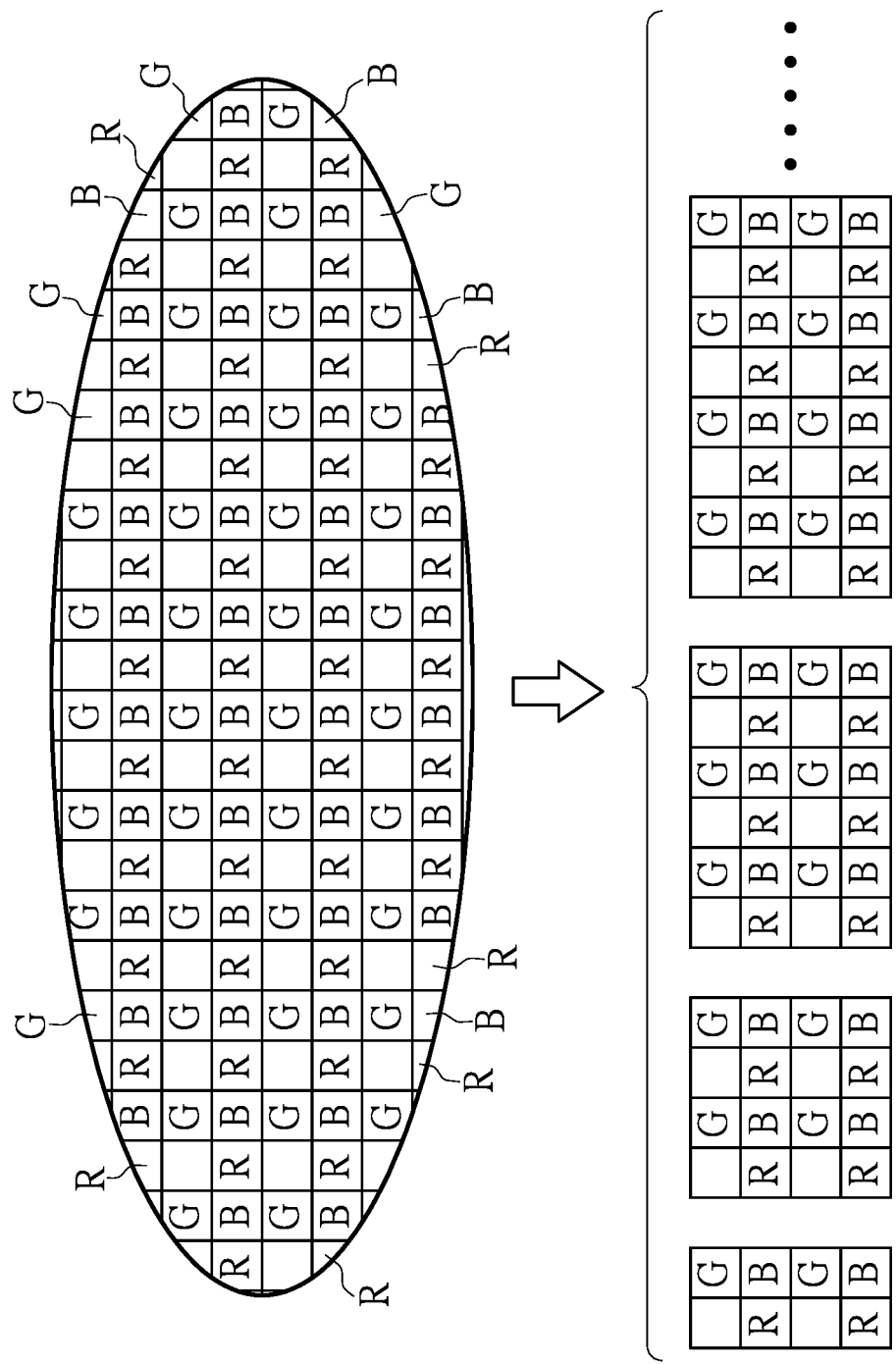
FIG. 11B is another schematic view of arranging and cutting the products of the present disclosure.
Figure 11C:
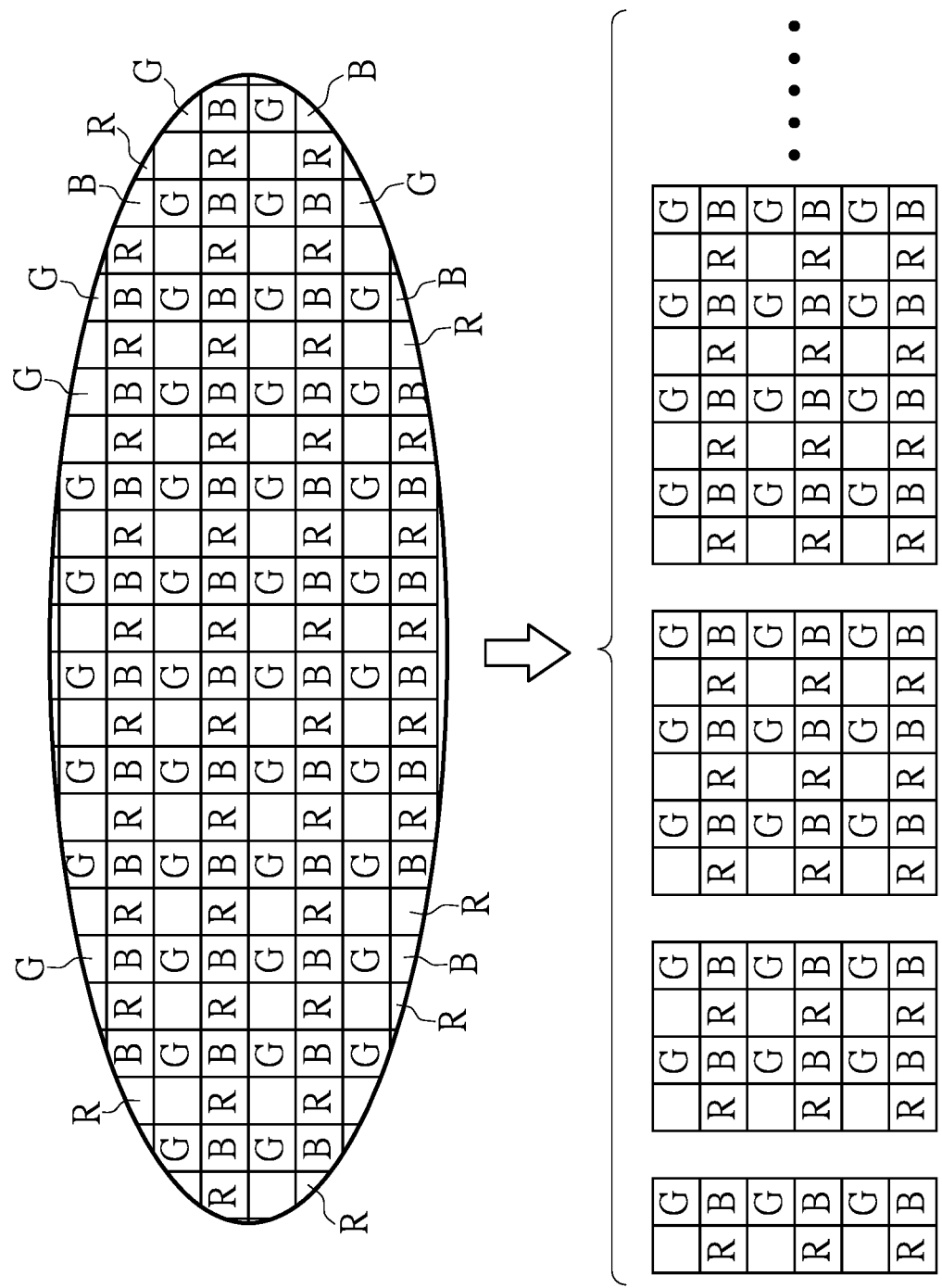
FIG. 11C is yet another schematic view of arranging and cutting the products of the present disclosure.
Figure 11D:
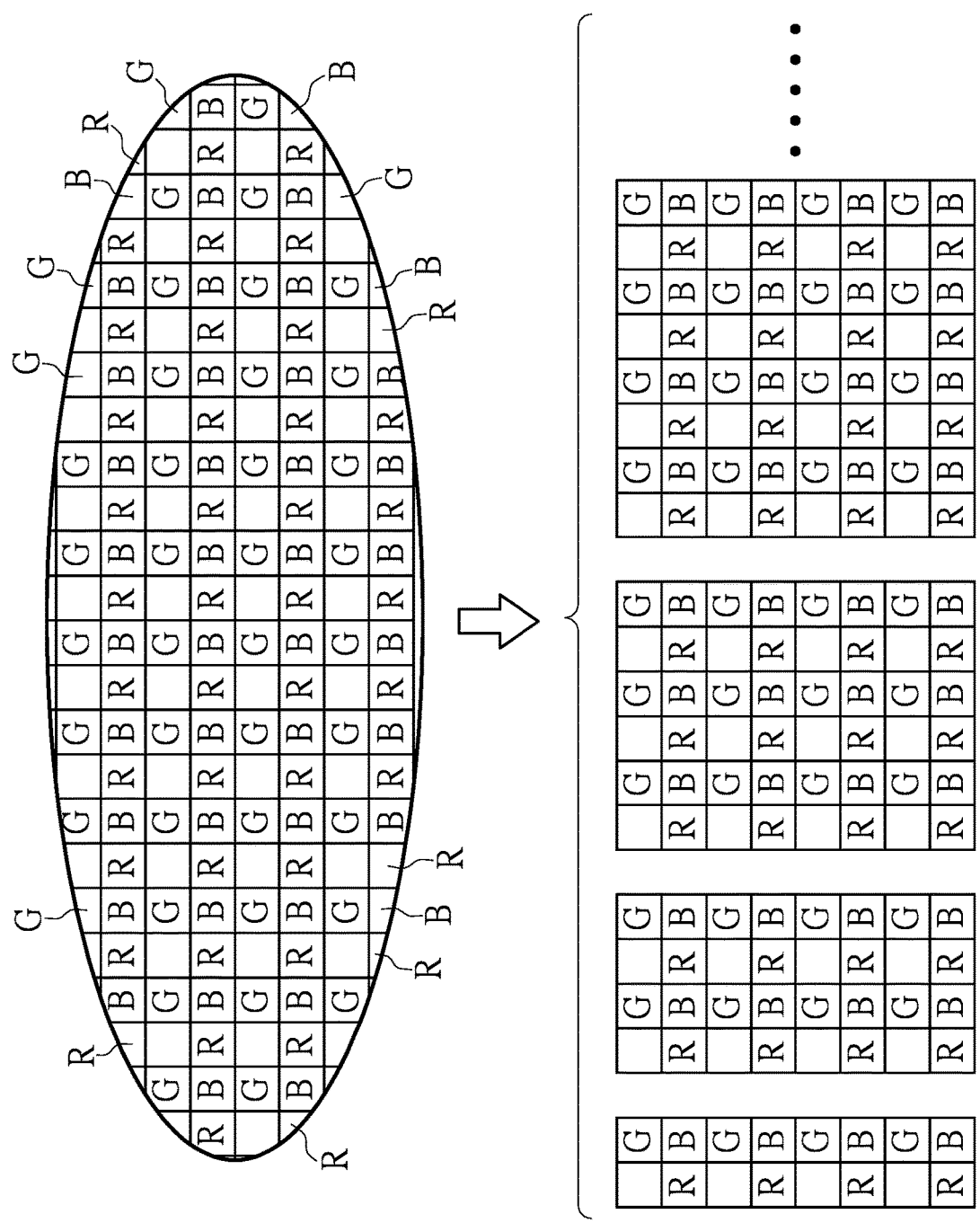
FIG. 11D is still another schematic view of arranging and cutting the products of the present disclosure.

FIGS. 11A to 11D show that in actual embodiments of the present disclosure, individual cutting may be performed, such that the actual embodiments of the present disclosure are to be cut into a strip-shaped display or a square shaped display according to actual display device requirements of different user ends, or actual requirements for different shapes of terminal display from client ends. As shown in FIG. 11A, a piece of RGB semiconductor wafer cam can be cut into a single display cell, a dual display cell, a triple display cell, and up to a strip-shaped display cell. As shown in FIG. 11B, in addition to the display cells shown in FIG. 11A, one row of RGB display cells is further added to the components shown in FIG. 11A. As shown in FIG. 11C, in addition to the display cells shown in FIG. 11B, one row of RGB display cells is further added to the components shown in FIG. 11C. As shown in FIG. 11D, in addition to the display cells shown in FIG. 11C, one row of RGB display cells is further added to the components shown in FIG. 11D. Therefore, the three-in-one RGB mini-LED device of the present disclosure can meet different requirements of customized display from the customer, and through the cutting step, cutting operations for different structure and shape may be performed, thereby providing the RGB mini-LED device that is aesthetic and meets requirements of structure, appearance, and shape to the customer.

In conclusion, the three-in-one RGB mini-LED device of the present disclosure has a thin thickness, is capable of separating the light-emitting face of a wafer and a chip into three or more independent electrical regions (as shown in FIG. 9A and FIG. 9B) that adopt a common anode or common cathode design. The opaque dam can be disposed on the wafer to produce chips of RGB color by coating on the chip in conjunction with the quantum dot materials of various wavelengths (as shown in FIG. 8A and FIG. 8B), or the opaque dam can be disposed on the transparent substrate 42 and the quantum dot materials of various wavelengths is coated in the dams 40, thereby forming the RGB quantum dot filter 44. The RGB quantum dot filter 44 is then adhered to the wafer to form the three colors (as shown in FIG. 7A and FIG. 7B). The wafer having three colors is then cut into multiple-in-one die sizes according to requirements, or a packaging process is performed to protect the wafer. Therefore, through the present disclosure, the quality of the lamp body can be greatly improved, and an RGB mini-LED structure having smaller size, higher light utilization rate, and precision controlled lighting pattern can be obtained. The present disclosure can be adopted in fields of RGB-LED lamps or RGB-LED displays having different shapes. The technical contents of the present disclosure are strongly suitable for patent application.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A three-in-one RGB (red, green, blue) mini-LED (light-emitting diode) device comprising an arrangement of a plurality of display cells, wherein each of the display cells includes:
    a substrate;
    a second electrical semiconductor layer disposed on the substrate;
    a plurality of multiple-quantum well layers disposed on the second electrical semiconductor layer, an area of each of the multiple-quantum well layers being smaller than an area of the second electrical semiconductor layer, and a portion of the second electrical semiconductor layer being not covered by the multiple-quantum well layers;
    a plurality of first electrical semiconductor layers correspondingly disposed on the multiple-quantum well layers, and an area of each of the first electrical semiconductor layers being equal to the area of each of the multiple-quantum well layers;
    a plurality of mirrors correspondingly disposed on the first electrical semiconductor layers and being in electrical contact with the first electrical semiconductor layers, and an area of each of the mirrors being smaller than the area of each of the first electrical semiconductor layers;
    a protecting layer covering on lateral sides of and above each of the mirrors and covering on lateral sides of and above each of the first electrical semiconductor layers, and the protecting layer covering on the second electrical semiconductor layer and exposing a plurality of first contact areas and a second contact area;
    a plurality of first metal electrodes, each of the first metal electrodes correspondingly disposed on each of the first contact areas;
    a second metal electrode disposed on the second contact area; and
    an RGB quantum dot filter disposed at a bottom of the substrate,
    wherein a part of the substrate is exposed to define a spacing region, and the spacing region is positioned between different adjacent display cells and is covered with nothing.

2. The three-in-one RGB mini-LED device according to claim 1, wherein the RGB quantum dot filter includes:
    a transparent substrate;
    a plurality of dams disposed on the transparent substrate, each of the dams being opaque; and
    a plurality of quantum dot materials of various wavelengths, each of the quantum dot materials of various wavelengths being correspondingly disposed in each of the dams.

3. The three-in-one RGB mini-LED device according to claim 1, wherein the first contact areas are upper surfaces of each of the mirrors exposed by the protecting layer having openings at positions above the mirrors, and edges of each of the mirrors are cladded by the protecting layer; and wherein the second contact area is an upper surface of the second electrical semiconductor layer exposed by the protecting layer having openings at positions above the portion of the second electrical semiconductor layer not covered by the multiple-quantum well layers.

4. The three-in-one RGB mini-LED device according to claim 1, wherein an area cladded by each of the first metal electrodes is greater than each of the first contact areas; and wherein an area cladded by the second metal electrode is greater than the second contact area.

5. The three-in-one RGB mini-LED device according to claim 1, further comprising a covering layer covering on the protecting layer and on each of the first metal electrodes, and exposing partial areas of upper surfaces of the first metal electrodes; wherein the covering layer simultaneously covers on the second metal electrode and exposes a partial area of an upper surface of the second metal electrode.

6. The three-in-one RGB mini-LED device according to claim 5, further comprising a plurality of first metal electrode bumps, each of the first metal electrode bumps being correspondingly disposed on the upper surfaces of the first metal electrodes having the partial areas thereof exposed.

7. The three-in-one RGB mini-LED device according to claim 5, further comprising a second metal electrode bump, the second metal electrode bump being correspondingly disposed on the upper surface of the second metal electrode having the partial area thereof exposed.

8. The three-in-one RGB mini-LED device according to claim 1, wherein the RGB quantum dot filter includes:
   a plurality of dams disposed on the bottom of the substrate, each of the dams being opaque;
   a plurality of quantum dot materials of various wavelengths, each of the quantum dot materials of various wavelengths being disposed correspondingly in each of the dams; and
   a packaging glue adhering on the dams and packaging the quantum dot materials of various wavelengths in the dams.

9. A three-in-one RGB mini-LED production method for producing the three-in-one RGB mini-LED device according to claim 1, wherein the production method includes:
   sequentially disposing the second electrical semiconductor layer, the multiple-quantum well layer, and the first electrical semiconductor layer on the substrate;
   depositing the plurality of mirrors on the first electrical semiconductor layer such that each of the mirrors being in electrical contact with the first electrical semiconductor layer;
   etching the first electrical semiconductor layer and the multiple-quantum well layer, exposing the second electrical semiconductor layer and forming the plurality of the first electrical semiconductor layers, and an area of each of the first electrical semiconductor layers being substantially greater than an area of each of the mirrors;
   depositing a protecting layer, exposing the first contact area above each of the mirrors, and exposing the second contact area above the second electrical semiconductor layer;
   disposing the first metal electrode above the first contact area, and the area of the first metal electrode being greater than the first contact area; and disposing the second metal electrode above the second contact area, and the area of the second metal electrode being greater than the second contact area;
   etching edges of the second electrical semiconductor layer, and exposing the substrate to be taken as the spacing region;
   preparing an RGB quantum dot filter, and adhering the RGB quantum dot filter to the bottom of the substrate; and
   cutting according to the spacing region, thereby cutting out a strip shape or a rectangle shape, and forming a three-in-one RGB mini-LED structure.

10. The three-in-one RGB mini-LED production method according to claim 9, wherein in the step of preparing the RGB quantum dot filter, a manner of preparation includes:
    forming a plurality of dams on a transparent substrate using an opaque material; and
    in conjunction with quantum dot materials of various wavelengths, coating the quantum dot materials of various wavelengths into the plurality of dams to form the RGB quantum dot filter.

11. The three-in-one RGB mini-LED production method according to claim 9, wherein after the step of etching the edges of the second electrical semiconductor layer, the following step is performed:
    covering, by a covering layer, and exposing only a partial area of the first metal electrode and a partial area of the second metal electrode, without covering the spacing region.

12. The three-in-one RGB mini-LED production method according to claim 11, wherein after the step of covering by the covering layer, a step of forming solder bumps is performed, and wherein a first metal electrode bump is formed on the first metal electrode, and a second metal electrode bump is formed on the second metal electrode.

13. The three-in-one RGB mini-LED production method according to claim 12, wherein after forming the solder bumps, a dielectric material is covered on the covering layer, the dielectric material is not covered on the spacing region, and the dielectric material is not covered on an upper side of the first metal electrode bump and an upper side of the second metal electrode bump.

14. The three-in-one RGB mini-LED production method according to claim 13, wherein after the step of covering the dielectric material, technologies such as thin film process, chemical plating, and printing technology are used to straighten spaces between electrodes of the first metal electrode bump and the second metal electrode bump.

15. A three-in-one RGB mini-LED production method for producing the three-in-one RGB mini-LED device according to claim 1, wherein the production method includes:
    sequentially disposing the second electrical semiconductor layer, the multiple-quantum well layer, and the first electrical semiconductor layer on the substrate;
    depositing the plurality of mirrors on the first electrical semiconductor layer such that each of the mirrors is in electrical contact with the first electrical semiconductor layer;
    etching the first electrical semiconductor layer and the multiple-quantum well layer, exposing the second electrical semiconductor layer, and an area of each of the first electrical semiconductor layers being substantially greater than an area of each of the mirrors;
    depositing a protecting layer, exposing the first contact area above each of the mirrors, and exposing the second contact area above the second electrical semiconductor layer;
    disposing the first metal electrode above the first contact area, and the area of the first metal electrode being greater than the first contact area; and disposing the second metal electrode above the second contact area, and the area of the second metal electrode being greater than the second contact area;
    etching edges of the second electrical semiconductor layer, and exposing the substrate to be taken as the spacing region;
    forming a plurality of dams on a back side of the substrate using an opaque material;
    coating quantum dot materials of various wavelengths into the plurality of dams; and
    cutting according to the spacing region, thereby cutting out a strip shape or a rectangle shape, and forming a three-in-one RGB mini-LED structure.

16. The three-in-one RGB mini-LED production method according to claim 15, wherein after the step of etching the edges of the second electrical semiconductor layer, the following step is performed:
    covering, by a covering layer, and exposing only a partial area of the first metal electrode and a partial area of the second metal electrode, without covering the spacing region.

17. The three-in-one RGB mini-LED production method according to claim 15, wherein after the step of covering by the covering layer, a step of forming solder bumps is performed, and wherein a first metal electrode bump is formed on the first metal electrode, and a second metal electrode bump is formed on the second metal electrode.

18. The three-in-one RGB mini-LED production method according to claim 15, wherein after forming the solder bumps, a dielectric material is covered on the covering layer, the dielectric material is not covered on the spacing region, and the dielectric material is not covered on an upper side of the first metal electrode bump and an upper side of the second metal electrode bump.

\* \* \* \* \*